United States Patent [19]

Kobori

[11] 4,016,508

[45] Apr. 5, 1977

[54] ELECTRONIC TIMEPIECE HAVING PLURAL CAPACITORS FOR SELECTIVELY ADJUSTING QUARTZ CRYSTAL OSCILLATOR OUTPUT FREQUENCY

[75] Inventor: Takenobu Kobori, Kawasaki, Japan

[73] Assignee: Kabushiki Kaisha Daini Seikosha, Japan

[22] Filed: Aug. 14, 1975

[21] Appl. No.: 604,779

[30] Foreign Application Priority Data

Aug. 23, 1974 Japan ...................... 49-101018[U]

[52] U.S. Cl. ........................... 331/116 R; 58/23 A; 58/33; 58/85.5; 331/179

[51] Int. Cl.² ....................... H03B 3/04; H03B 5/36

[58] Field of Search ........... 331/116 R, 158, 177 R, 331/179; 58/23 R, 23 A, 23 AC, 33, 85.5

[56] References Cited

UNITED STATES PATENTS 3,690,546 9/1972 Uehara .......................... 331/158 X 3,838,566 10/1974 O'Connor et al. ......... 331/116 R X

*Primary Examiner*—Siegfried H. Grimm

*Attorney, Agent, or Firm*—Robert E. Burns; Emmanuel J. Lobato; Bruce L. Adams

[57] ABSTRACT

An electronic timepiece has a quartz-crystal oscillator which generates a high frequency output signal and applies it to a divider which divides the signal into a lower frequency output signal suitable as a time base. A manually actuated switch selectively effects electrical connection of one or more capacitors to the quartz-crystal oscillator to accordingly adjust the oscillator output frequency. The number of actuations of the switch determines, through a counter and gate circuitry, which capacitors are connected to the oscillator, and light-emitting diodes visually indicate which capacitors are connected to the oscillator.

8 Claims, 2 Drawing Figures

ELECTRONIC TIMEPIECE HAVING PLURAL CAPACITORS FOR SELECTIVELY ADJUSTING QUARTZ CRYSTAL OSCILLATOR OUTPUT FREQUENCY

BACKGROUND OF THE INVENTION

This invention relates to an electronic timepiece using a quartz-crystal oscillator whose frequency can be adjusted electronically and more particularly, to an electronic timepiece wherein the capacitance value of said oscillator is attained by selecting one or some of a plurality of capacitors.

Conventionally, the frequency of the output signal of a quartz-crystal oscillator for use as a time standard signal for a timepiece is varied by changing the capacitance of a trimmer capacitor.

However, in this case, it is drawback for this adjustment since a screw driver is needed for adjusting the trimmer capacitor.

SUMMARY OF THE INVENTION

The object of this invention is to provide an electronic timepiece which eliminates the above drawback.

Another object of this invention is to provide an electronic timepiece wherein the frequency of the oscillator is adjusted by selecting one or some of a plurality of capacitors.

A further object of this invention is to provide an electronic timepiece wherein the frequency of the oscillator is adjusted by actuating a switch provided for effecting time correction.

In accordance with this invention, an electronic timepiece comprises an oscillator having a quartz-crystal oscillator and a plurality of capacitors for adjusting the frequency of said oscillator. One or some of said capacitors for adjusting the frequency are selected electrically by the output signal of a counter, such as a ring-counter or the like.

The foregoing and other objects as well as the characteristic features of the invention will become more apparent and more readily understandable by the following description and the appended claims when read in conjunction with the accompanying drawings.

DESCRIPTION OF THE PREFERRED EMBODIMENT

Figure 1:
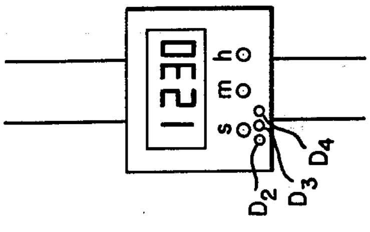
FIG. 1 shows in schematic form the external appearance of a quartz-crystal electronic timepiece embodying this invention.

Referring now to FIG. 1, FIG. 1 shows the external appearance of an electronic timepiece having manually actuated switches S, m and h for effecting time correction and light emitting diodes $D_2$, $D_3$ and $D_4$.

Figure 2:
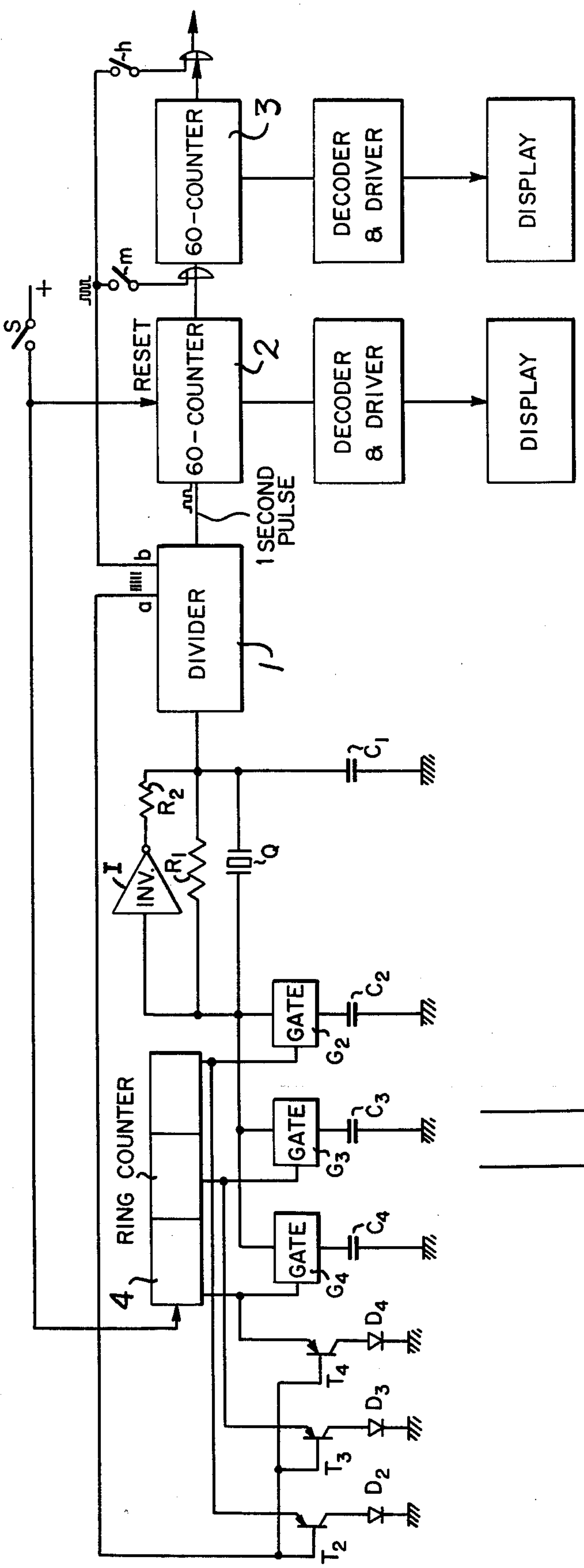
FIG. 2 shows a circuit diagram for a timepiece embodying this invention.

FIG. 2 shows a circuit diagram of an electronic timepiece having a C-MOS inverter I, feedback resistor $R_1$, resistor $R_2$ for preventing radio wave oscillation, and an oscillator composed of quartz-crystal oscillator Q, capacitor $C_1$ and capacitors $C_2$, $C_3$ and $C_4$ for adjusting the frequency divider 1 is connected to the oscillator and receives therefrom the high frequency output signal and divides it into a lower frequency 1 second pulse which is fed to a 60-counter 2 which counts the 1 second pulse and delivers a counted output signal to a 60-counter 3 which counts the output pulse of the 60-counter 2 and delivers a counted output signal to a 24-counter (not shown in FIG. 2).

Now, when capacitor $C_2$ for adjusting the frequency of the oscillator is operated by the conductive condition change of gates $G_2$, the output count signal (content) condition of counting means in the form of a ring-counter 4 changes to logic level

001.

In this case, the light emitting diode $D_2$ begins flashing in response to the output signal of the ring-counter 4 and informs the operator that the capacitor $C_2$ for adjusting the frequency has been placed in operation.

Next, when the operator pushes the switch S for effecting time correction, the output count signal (content) condition of the ring-counter 4 changes to logic level

100 and the light emitting diode $D_4$ begins to flash and simultaneously, gate $G_4$ becomes opened and gates $G_2$ and $G_3$ close, so that capacitor $C_4$ for adjusting the frequency is placed in operation.

Further, in the circuit of the electronic timepiece as shown in FIG. 2, the 60-counter 2 which counts the second pulse is reset by the output signal of the switch S when the capacitor $C_2$ for adjusting the frequency is removed from operation and replaced by the capacitor $C_4$.

When the operator wants to employ capacitor $C_3$ for adjusting the frequency of the oscillating action, he has only to switch on switch S for effecting second-correction so that the output count signal condition of the ring-counter 4 becomes to logic level

010.

As mentioned above, according to this invention, the frequency of the quartz-crystal oscillator is adjusted easily since one of capacitors $C_2$, $C_3$ and $C_4$ for adjusting the frequency is selected electronically by selectively actuating the switch S for time correction in its conductive condition.

If capacitors $C_2$, $C_3$ and $C_4$ are all made equal in capacitance value, a manufacturer has only to select an optimum frequency capacitor when a plurality of such capacitors are assembled in an electronic timepiece. Also, according to this invention, the capacitance of the capacitor for adjusting the frequency is able to vary by selecting one or some of a plurarity of capacitors in case of using a counter instead of a ring-counter.

Still further, the gates $G_2$, $G_3$ and $G_4$ respectively may comprise an n-channel or p-channel field effect transistor.

What is claimed is:

1. In an electronic timepiece: a quartz-crystal oscillator for generating a high frequency output signal; a divider connected to said quartz-crystal oscillator for receiving therefrom the high frequency output signal and dividing it to a lower frequency output signal suitable as a time base; and means for selectively adjusting the frequency of said quartz-crystal oscillator high frequency output signal comprising a plurality of capacitors each having a preselected capacitance value, and means including a manually actuatable switch for selectively electrically connecting predetermined ones of said capacitors to said quartz-crystal oscillator in accordance with the number of actuations of said switch to accordingly selectively adjust the frequency of said quartz-crystal oscillator output signal.

2. An electronic timepiece according to claim 1; wherein said means for selectively electrically connecting predetermined ones of said capacitors to said quartz-crystal oscillator comprises counting means for counting the number of actuations of said switch and providing corresponding count signals, and means including a plurality of gates each connected between one of said capacitors and said quartz-crystal oscillator and responsive to one of the count signals to electrically connect its associated capacitor to said quartz-crystal oscillator.

3. An electronic timepiece according to claim 2; wherein said counting means comprises a ring counter.

4. An electronic timepiece according to claim 2; further including indicating means for providing a visual indication indicative of which of said capacitors is electrically connected to said quartz-crystal oscillator.

5. An electronic timepiece according to claim 4; wherein said indicating means comprises a plurality of light-emitting diodes.

6. An electronic timepiece according to claim 5; including means electrically connecting said counting means to said light-emitting diodes to effect energization of said diodes in response to respective ones of the count signals.

7. An electronic timepiece according to claim 1; further including indicating means for providing a visual indication indicative of which of said capacitors is electrically connected to said quartz-crystal oscillator.

8. An electronic timepiece according to claim 7; wherein said indicating means comprises a plurality of light-emitting diodes.

* * * * *